United States Patent [19]

Suzuki et al.

[11] Patent Number: 4,641,035

[45] Date of Patent: Feb. 3, 1987

[54] APPARATUS AND A METHOD FOR POSITION DETECTION OF AN OBJECT STEPPED PORTION

[75] Inventors: Akiyoshi Suzuki, Tokyo; Hideki Ina, Yokohama, both of Japan

[73] Assignee: Canon Kabushiki Kaisha, Tokyo, Japan

[21] Appl. No.: 642,760

[22] Filed: Aug. 21, 1984

[30] Foreign Application Priority Data

Aug. 31, 1983 [JP] Japan ................... 58-159652

[51] Int. Cl.$^4$ .................. G01N 21/86; G01V 9/04
[52] U.S. Cl. ...................... 250/548; 356/400
[58] Field of Search ............... 250/548, 557; 356/400, 356/376

[56] References Cited

U.S. PATENT DOCUMENTS

| | | | |
|---|---|---|---|
| 3,739,247 | 6/1973 | Yamaguchi et al. | 356/400 |
| 3,885,877 | 5/1975 | Horwath et al. | 356/400 |
| 4,092,068 | 5/1978 | Lucas et al. | 356/376 |
| 4,112,309 | 9/1978 | Nakazawa et al. | 356/445 |
| 4,406,546 | 9/1983 | Suzuki et al. | 356/400 |
| 4,553,845 | 11/1985 | Kuroki et al. | 356/400 |

*Primary Examiner*—David C. Nelms
*Assistant Examiner*—Michael Messinger
*Attorney, Agent, or Firm*—Fitzpatrick, Cella, Harper & Scinto

[57] ABSTRACT

An apparatus and method for position detection for an object having a detection pattern formed by a concavity or convexity. The position detecting apparatus includes a scanning system for scanning the object with a light beam, a photoelectric transducer for receiving the information light reflected from the detection pattern to produce an electric signal, and a processing unit for computing, on the basis of the electric signal, the position of the detection pattern. Unwanted components included in the information light are prevented from being received by the photoelectric transducer, or electric signals corresponding to the unwanted components are excluded, so that the accuracy of signal processing and the accuracy of position detection are improved.

8 Claims, 21 Drawing Figures

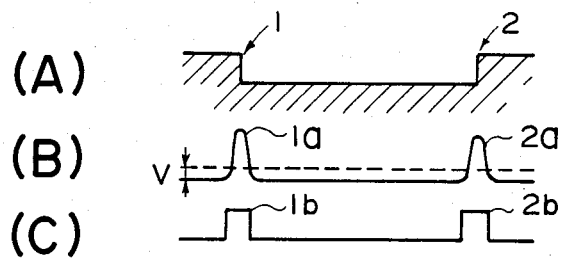
F I G. 1
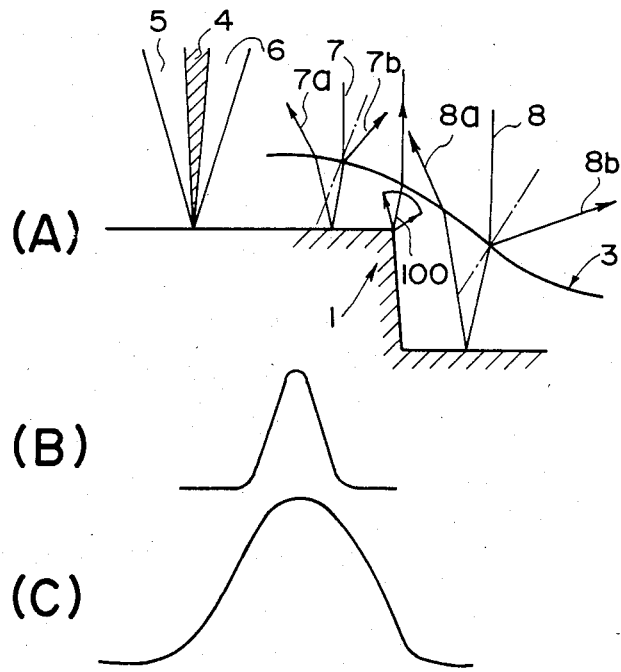
F I G. 2
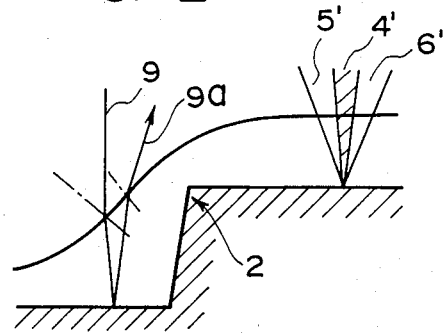
F I G. 3

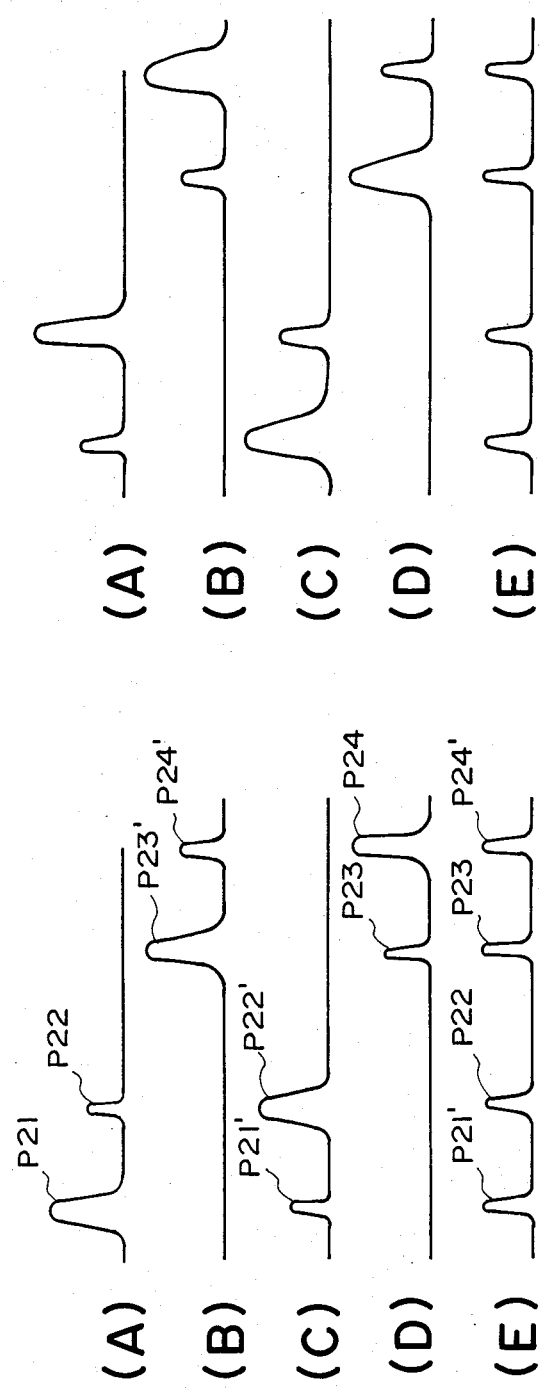

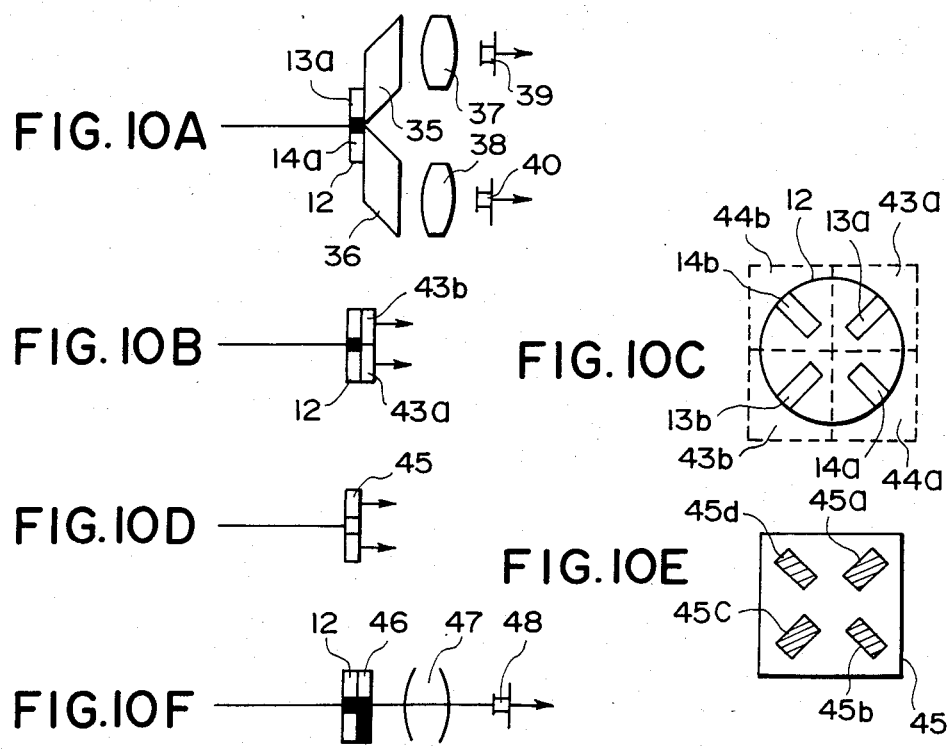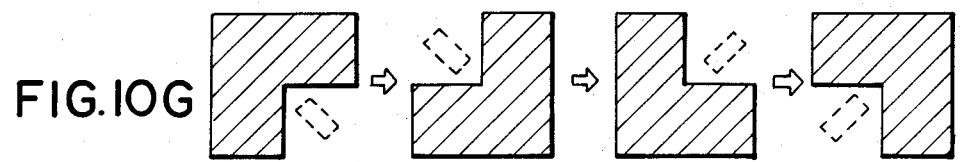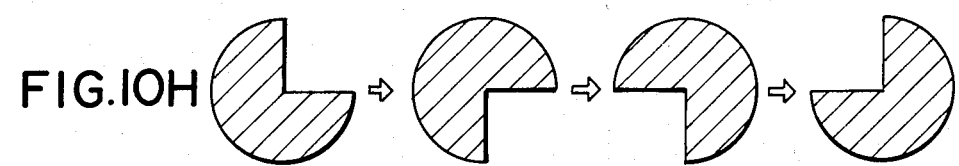

APPARATUS AND A METHOD FOR POSITION DETECTION OF AN OBJECT STEPPED PORTION

BACKGROUND OF THE INVENTION

This invention relates to an apparatus and a method for position detection of high accuracy, to be used, for example, in relative alignment between a photomask and a wafer in the manufacture of semiconductor circuit devices, or in absolute alignment of a wafer in a wafer inspecting device.

The relative alignment is disclosed in U.S. Pat. No. 4,167,677, U.S. Pat. No. 4,199,219 or the like. According to these disclosures, a photomask and a wafer, for the manufacture of semiconductor circuits, are provided with alignment mark patterns, respectively, the photomask and wafer being disposed with a minute spacing or a projection optical system intervened therebetween. The mark patterns of the photomask and the wafer are scanned by a laser beam having spot-like or bar-like cross-section to detect the relative position of the mark patterns to thereby measure the degree of misalignment between the mask and the wafer.

FIG. 1 shows the relation between an automatic alignment mark pattern (which will hereinafter be referred to simply as "AA pattern") formed on a wafer and an automatic alignment signal (which will hereinafter be referred to simply as "AA signal") obtainable therefrom by the laser beam scanning and photoelectric conversion. In FIG. 1, a part (A) shows in an enlarged cross-sectional view the AA pattern having edges 1 and 2. When the wafer surface is scanned by a laser beam in the direction parallel to the sheet of the drawing, the laser beam is diffracted and scattered by the edges 1 and 2 of the AA pattern. The diffracted and scattered light beams are received by photodetecting means, not shown in this Figure, so that they are converted into an electric signal having a waveform such as shown at a part (B) of FIG. 1. Pulses 1a and 2a of the waveform correspond to the edges 1 and 2 of the AA pattern. These pulses are cut at a predetermined threshold V and, by binarization, they are reformed into pulses 1b and 2b shown at a part (C) of FIG. 1. The thus reformed signal is compared with a similar signal obtained in respect to a mask (not shown) or is compared with a reference established in the photodetecting means, whereby an error signal for achieving the alignment is produced.

After completion of the alignment, an exposure step is effected wherein the mask is illuminated by exposure light so that a photoresist material applied onto the wafer is exposed to an actual element pattern (circuit pattern) of the mask.

As is well known in the art, the photoresist layer of transparent material has already been applied onto the wafer prior to the above-described position detection of the wafer. It has been found that the presence of such transparent material layer substantially influences the detection of the AA pattern through the transparent material layer. More specifically, it has been found that, when the wafer is coated with a photoresist layer, the width of the pulse corresponding to the edge of the AA pattern becomes greater than that obtainable from the same edge of the AA pattern when no photoresist layer is formed on the wafer. This phenomenon degrades the signal detecting accuracy.

FIG. 2 illustrates the principle of such phenomenon. In FIG. 2, a part (A) shows the edge 1 of the AA pattern formed by a concavity defined in the wafer surface. The wafer surface is coated with a photoresist layer 3 so that, according to the direction of inclination of the stepped portion 1 of the AA pattern, the surface of the photoresist 3 is inclined downwardly in the rightward direction as viewed in FIG. 2. According to the known dark-field laser scanning technique, such as disclosed in the above-described U.S. Patents, the scanning laser beam is perpendicularly incident on the wafer surface. If the portion of the wafer surface on which the beam is incident comprises a mirror surface, the incident light is specularly reflected so that it goes back along the oncoming path such as denoted by the hatched region 4. If on the other hand, the laser beam is incident on the edge of the AA pattern, the laser beam is scattered and diffracted by the edge so that the diffracted rays trace regions 5 and 6 as well as the region 4. At a pupil plane of the alignment optical system (alignment scope), the reflected light from the wafer is subjected to the spatial frequency filtering whereby the direct reflection light, tracing the region 4, which has been specularly reflected from the wafer (i.e. the reflected light which has not diffracted or scattered by the edge of the AA pattern) is intercepted; whereas the scattered and diffracted light tracing the regions 5 and 6 is transmitted so that it is directed to a photoelectric detector (not shown in this drawing). In this manner, the known dark-field scanning technique selects only the scattered light and directs it to the detector to obtain an AA signal.

Now, the influence of the presence of the photoresist coating on the detection of the edge of the AA pattern will be considered. In the part (A) of FIG. 2, the laser beams 7 and 8 are not directed to the edge of the AA pattern. Since, however, the surface of the photoresist layer is inclined as described in the foregoing, the laser beams 7 and 8 are deflected by the prism action at the resist surface so that the reflected rays of the laser beams 7 and 8 will travel in a region such as 5 or 6 along which the scattered light from the edge of the AA pattern travels. Since the reflected rays of the laser beams 7 and 8 tracing the region 5 or 6 will also be detected by the photodetector, the resulting AA signal contains a pulse of greater width such as shown in a part (C) of FIG. 2 as compared with the AA signal shown in a part (B) of FIG. 2 which is obtainable from the same edge 1 when no resist layer is formed on the wafer surface. As will be easily understood, the increase in the pulse width varies depending on the inclination or the like of the resist coating. The variation of the pulse width of the signal corresponding to each edge of the AA patterns is a serious factor of error in the position detection of the edge.

In order to avoid this, it may be contemplated that the resist material on the part of the AA pattern is removed. However, this requires an additional step for removing the resist on the AA pattern.

SUMMARY OF THE INVENTION

It is accordingly a primary object of the present invention to provide new and useful apparatus and method for position detection which are free from the above-described problems and which ensure correct detection of a pattern formed on an object, for the purpose of the detection of the object, or a pattern similar to the former.

A second object of the present invention is to provide new and useful apparatus and method for position detection which are effective to prevent degradation of detection signals which may otherwise be caused by the presence of a transparent layer on an object.

A third object of the present invention is to provide new and useful apparatus and method for position detection which are effective to receive, in a best mode, the information light from a detection pattern of a predetermined formation.

In order to achieve these objects, the present invention in one aspect thereof provides an apparatus for detecting the position of an object having a detection pattern formed thereon by a concavity or convexity, comprising means for scanning a light beam and the object relative to each other, means for computing the position of the detection pattern, said computing means having means for receiving the light emitted from the object and containing information on the detection pattern, and means for excluding an unwanted component of the information light to prevent the unwanted component from participating in the computation by the computing means.

Further, in accordance with one embodiment of the present invention which will be described later, there is provided an apparatus for position detection comprising a scanning system for scanning a detection pattern formed on an object, along a scanning line with a scanning beam of spot-like or bar-like cross-section, a light receiving system for receiving the light reflected from the detection pattern and containing the information on the detection pattern, and a control system for controlling the light receiving system so that an unwanted portion of the information light is excluded in accordance with whether the detection pattern comprises a concavity or convexity formed on the object and/or in accordance with the direction, with respect to the scanning line, of the edge of the stepped portion defined at the boundary between the detection pattern and the other area of the object. The control system is arranged to select, after photoelectric conversion of the information light, only the wanted signal component, or is adapted to prevent the unwanted portion of the information light from being incident on a detector of the light receiving system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 illustrates the relation between an alignment mark having edges and an alignment signal corresponding to the alignment mark;

FIG. 2 illustrates the influence of a photoresist layer at one of the edge portions of the alignment mark upon the travel of the scanning beams and upon the alignment signal;

FIG. 3 illustrates the influence of the photoresist layer at another edge portion of the alignment mark upon the travel of the scanning beam;

FIGS. 8 and 9 are views showing signal waveforms corresponding to the automatic alignment patterns of FIG. 6 and obtained through the use of the filter element of FIG. 7;

FIGS. 10A–10F are views showing various forms of the light receiving sections according to the present invention, wherein FIGS. 10A, 10B, 10D and 10F are cross-sectional views while FIGS. 10C and 10E are plan views;

FIGS. 10G and 10H illustrate the operation of shutter means, respectively;

DESCRIPTION OF THE PREFERRED EMBODIMENTS

Figure 4:
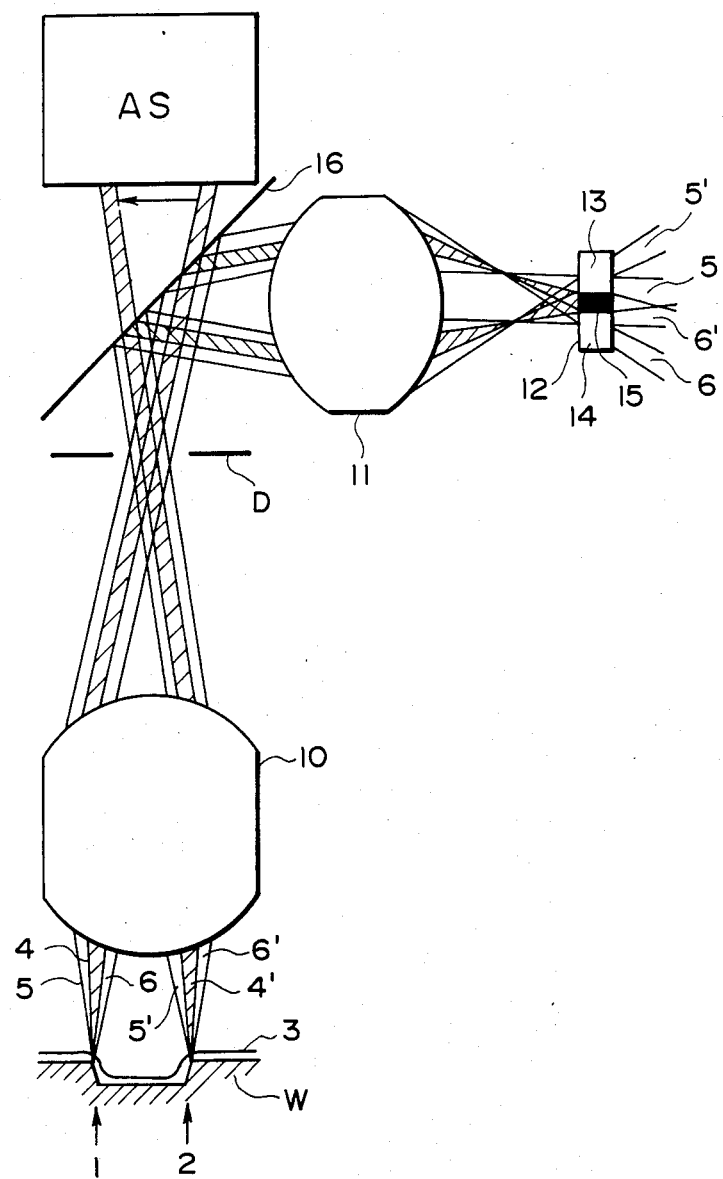
FIG. 4 is an optical cross-section showing the major part of a position detecting apparatus according to one embodiment of the present invention.

Referring back to FIG. 2, the influence of the photoresist layer will now be further considered. With regard to the scanning beams 7 and 8, the influence of the photoresist layer 3 can be analyzed as follows: First, the photoresist layer 3 allows transmission of a transmissively reflected light beam (direct reflection light), such as denoted at 7a or 8a, through the photoresist layer 3, which is reflected by the wafer surface and again transmitted through the photoresist layer. Second, the photoresist layer 3 reflects surface reflection light, such as denoted at 7b or 8b, on the surface of the photoresist layer. As is well known in the art, the reflection factor at the interface between the photoresist and the air is very small, of the order of 4%. Therefore, the surface reflection light can be disregarded, so that the reflection light of the incident laser beam 7 or 8 can be considered as being composed substantially only of the transmissively reflected component 7a or 8a.

On the other hand, the laser beam incident on the edge 1 is scattered and diffracted thereby and the scattered rays are directed to an expanded region such as shown in FIG. 2, central ray being denoted by a reference numeral 100. According to the known detecting technique as described in the foregoing, the scattered rays from the edge 1 travelling in both the regions such as 5 and 6 in FIG. 2 are taken up for the sake of the detection of the edge.

It will be therefore understood that what causes the increase in the width of the pulse as has been discussed with reference to the part (C) of FIG. 2 is chiefly the transmissively reflected components 7a and 8a. These transmissively reflected components 7a and 8a travel in the direction of the region 5. In view of this, the rays travelling in the region 6 are selectively detected while the rays travelling in the region 5 are blocked according to the present invention, whereby an alignment signal accurately corresponding to the edge can be produced with a good S/N ratio.

While FIG. 2 shows a downwardly stepped portion in the rightward direction as viewed in the figure, FIG. 3 shows another edge 2 which is defined by an upwardly stepped portion in the rightward direction as viewed in the figure. In FIG. 3, a transmissively reflected component 9a of a laser beam 9 which is the major factor of the increase in the pulse width travels in the upward and rightward direction, i.e. in the direction of the region 6'. In this case, only the scattered and diffracted rays travelling in the direction of the region 5' are selectively detected, as compared with the FIG. 2 case, whereby an alignment signal accurately corresponding to the edge 2 can be produced.

FIG. 4 shows an example of the optical arrangement for achieving the selective detection of the rays. In FIG. 4, a scanning optical system generally designated by a reference character AS is of a known type comprising a laser beam source and an optical scanner. The source is not limited to the laser beam source, and a light source supplying visible or invisible light may be employed. The optical scanner may be a polygonal mirror, galvano mirror, acousto-optic element or the like. A wafer W has an AA pattern formed by a concavity defining left-hand and right-hand edges 1 and 2. In a case where the wafer W is to be relatively aligned with a mask, the latter is disposed in a plane which is slightly spaced apart from the wafer W. Since the manner of detection of the mask is substantially the same as in the conventional technique, illustration and description thereof are omitted herein for the sake of simplicity.

The detecting system of FIG. 4 further includes a microscopic objective lens of telecentric type, a condenser lens 11, a half mirror 16 for dividing out a light receiving path from the projection optical path, a stop D disposed in a focal plane of the objective lens 11 and a spatial frequency filter 12 having transmitting sections 13, 14 and a non-transmitting section 15. The filter 12 will be described later in detail.

For the purpose of illustration, FIG. 4 shows the laser beam at two points during the scanning period, the laser beams at these points being depicted by hatched areas. When, during scanning of the wafer W coated with the resist material 3, the laser beam is incident on the edges 1 and 2, the rays diffracted by the edges 1 and 2 and travelling in the regions 5, 6, 5' and 6' pass through the transmitting sections 13 and 14 of the spatial frequency filter 12. The specularly reflected rays from the wafer W or the rays travelling in the regions 4 and 4' are blocked by the non-transmitting section 15 of the filter 12. As is shown in this Figure, the filter 12 is disposed in the Fourier transform plane (pupil plane) with respect to the scan surface. Therefore, those of the reflected rays from the surface scanned as having the same angular component (for example, the diffracted rays 5 and 5'; the diffracted rays 6 and 6') pass through the same section of the filter 12. In the case of the FIG. 4 arrangement, the diffracted rays 5 and 5' pass through the transmitting section 13 while the diffracted rays 6 and 6' pass through the transmitting section 14. As has already been discussed with reference to FIGS. 2 and 3, the transmissively reflected rays from the stepped portions caused by the presence of the photoresist layer 3 are mixedly included in the diffracted rays 5 (with respect to the stepped portion 1) or in the diffracted rays 6' (with respect to the stepped portion 2). In view of this, only the rays transmitted through the transmitting section 14 are taken up as the signal for the step 1 while only the rays transmitted through the transmitting section 13 are detected as the signal for the step 2, according to the present invention, whereby the edges can be detected very accurately.

Figure 5:
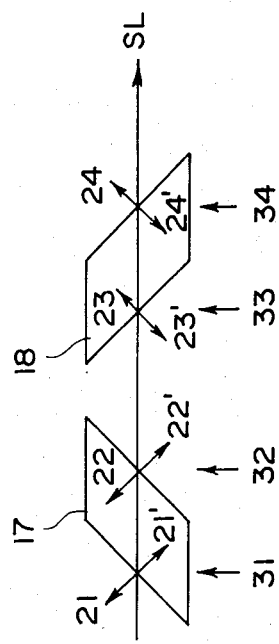
FIG. 5 is an enlarged plan view showing an example of an automatic alignment pattern.

FIG. 5 shows an example of an AA pattern. The AA pattern is composed of mark elements 17 and 18 which are inclined relative to the scanning line SL at angles of 45 degrees and −45 degrees, respectively. The laser beam having a spot-like or bar-like cross-section scans the AA pattern along the scanning line SL. During this scanning, the laser beam is diffracted at four edges 3, 32, 33 and 34 in the directions of arrows 21, 21', 22, 22', 23, 23', 24 and 24'. Since the AA pattern shown in FIG. 5 is inclined relative to the scanning line, the diffracted rays are directed inclinedly relative to the scanning line, i.e. in the directions perpendicular to the direction of each edge.

Figure 6:
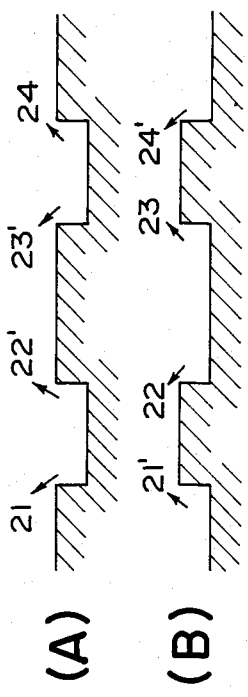
FIG. 6 is a view showing, in an enlarged scale, cross-sections of the automatic alignment patterns formed by concavities and convexities.

As has been described with reference to FIGS. 2 and 3, the direction of inclination of the resist surface differs depending on whether the AA pattern is formed by concavities or convexities. This leads to that the direction of the transmissively reflected component, which has been refracted by the resist layer, from the wafer surface in the vicinity of the edge also differs depending on whether the AA pattern is defined by concavities or convexities. This is illustrated in FIG. 6. In FIG. 6, a part (A) shows the AA pattern of FIG. 5 as being provided by concavities, while a part (B) shows the AA pattern of FIG. 5 as being formed by convexities. Arrows in FIG. 6 show the directions of travel of the transmissively reflected rays (direct reflection rays) which have been refracted by the resist layer. For example, in the part (A) the transmissively reflected component at the left-hand edge of the left-hand concavity are directed in the direction of arrow 21, while, in the part (B) the transmissively reflected component at the left-hand edge of the left-hand convexity is directed in the direction of arrow 21'.

It will be understood from the foregoing that, once during designing of the AA pattern whether the AA pattern is to be made by concavities or convexities is determined, the direction of advance of the transmissively reflected component at each edge, that is, the region into which the unwanted component is mixed can be forcasted.

Figure 7:
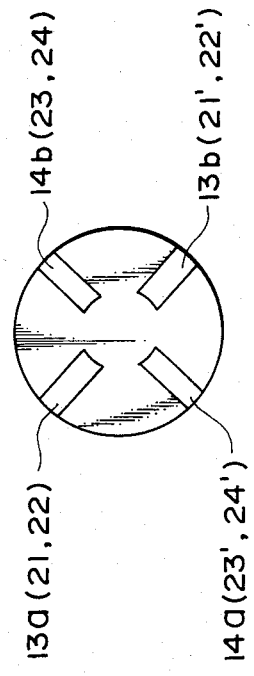
FIG. 7 is a plan view showing a filter element according to the present invention.

FIG. 7 is a plan view showing the filter 12 disposed in the pupil plane. The filter 12 has four transmitting sections 13a, 13b, 14a and 14b for transmitting therethrough the diffracted rays as denoted by parenthesized numerals, respectively, the numerals being corresponding to those in FIG. 5.

In this embodiment, the transmitting sections 13a, 14a, 13b and 14b of the filter 12 are selectively used to selectively detect the diffracted rays, in order to prevent the transmissively reflected component from being taken up. More specifically, in a case where the AA pattern is formed by concavities such as shown in the part (A) of FIG. 6, the transmitting sections of the filter 12 are selectively used in the sequence of 13b, 13a, 14b and 14a in order to sequentially take up the diffracted rays passing through the corresponding transmitting sections and to intercept the rays as designated by the arrows in the part (A) of FIG. 6, whereby a correct AA signal can be produced. If, on the other hand, the AA pattern is formed by convexities such as shown in the part (B) of FIG. 6, the transmitting sections of the filter 12 is sequentially used in the order of 13a, 13b, 14a and 14b to sequentially take up the diffracted rays passing through the corresponding transmitting sections, whereby a correct AA signal can be produced. In this manner, the rays passing through the pupil plane are selectively detected in accordance with the shape (concavity or convexity) of the AA pattern, whereby a correct AA signal is produced.

The selection of the rays can be achieved either by the provision of separate photoreceptors for the respective transmitting sections wherein the signals from the photoreceptors are selectively used, or by the provision of a single photoreceptor wherein the rays passing through the transmitting sections are selectively directed to the photoreceptor. When separate photoreceptors are to be used, they may be provided by discrete elements or may be provided by a four-division detector.

FIG. 8 shows the waveforms of the signals obtained through the use of the filter shown in FIG. 7 in a case where the AA pattern of FIG. 5 is formed by concavities, while FIG. 9 shows the waveforms of the signals in a case where the AA pattern of FIG. 5 is provided by convexities. In FIG. 8, the waveform (A) corresponds to the signal produced by the rays transmitted through the transmitting section 13a; the waveform (B) corresponds to the signal produced by the rays transmitted through the transmitting section 14a; the waveform (C) corresponds to the signal produced by the rays transmitted through the transmittig section 13b; and the waveform (D) corresponds to the signal produced by the rays transmitted through the transmitting section 14b. Similarly in FIG. 9, the waveform (A) corresponds to the signal from the transmitting section 13a; the waveform (B) corresponds to the signal from the transmitting section 14a; the waveform (C) corresponds to the signal from the transmitting section 13b; and the waveform (D) corresponds to the signal from the transmitting section 14b.

In the waveforms (A) and (C) of FIG. 8, the diffracted rays at the edges of the left-hand mark element 17 of FIG. 5 are taken up as the pulses P21 and P22; P21' and P22'. Since the direction of diffraction by the AA pattern is determined according to the direction of edge, no ray is detected through the transmitting sections 14a and 14b (FIG. 7). Subsequently, the diffracted rays from the edges of the right-hand mark element 18 are taken up through the transmitting sections 14a and 14b. This is shown in the waveforms (B) and (D) of FIG. 8 as the pulses P23' and P24'; P23 and P24. Among these pulse signals, the pulses P21', P22, P23 and P24' are combined into a pulse train such as shown in the waveform (E) of FIG. 8, on the basis of which, the computation is effected to produce an AA signal. In a case where the AA pattern is formed by convexities, the transmissively reflected components are eliminated in a similar manner as in FIG. 8 case, and a combined signal including corresponding pulses p21, P22', P23' and P24 can be obtained. This is self-explanatorily illustrated in FIG. 9. On the basis of the combined signal thus obtained, the computation is effected to produce an AA signal.

FIGS. 10A–10H show various forms of the element or elements to be disposed downstream of the condenser lens 11 shown in FIG. 4. FIG. 10A shows prisms 35 and 36 for optically connecting the transmitting sections 13a and 14a of the filter 12 to separate optical paths, respectively, on which condenser lenses 37 and 38 are disposed respectively to direct the rays to separate photoreceptors 39 and 40. In the FIG. 10A embodiment, similar two prisms, two condensing lenses and two photoreceptors are additionally disposed in a plane orthogonal to the sheet of the drawing, whereby all of the four transmitting sections of the filter 12 are optically connected to the respective detection systems.

FIG. 10B shows a four-division detector (a unit detector comprising four independently operable detecting or sensitive regions) which is disposed just behind the filter 12. While only two detecting regions 43a and 43b are shown in FIG. 10B, the detector includes, as is best shown in FIG. 10C, four detecting regions 43a, 44a, 43b and 44b which cover the four transmitting sections 13a, 14a, 13b and 14b, respectively.

If the four-division detector is modified so that each sensitive region has a shape such as that of each transmitting section of the filter 12 shown in FIG. 7, the filter can be omitted. FIGS. 10D and 10E show such modified form of four-division detector 45, wherein FIG. 10D is a side view and FIG. 10E is a front view, the sensitive regions being denoted by reference numerals 45a–45d.

FIG. 10F shows a single-photoreceptor arrangement. This modification employs a shutter element 46 such as a liquid crystal shutter or a mechanical shutter to selectively open/close the transmitting sections of the filter 12. The shutter 46 is disposed just behind the filter 12, and the light beam passed through the shutter element is directed by a condensing lens 47 to a photoreceptor 48.

FIG. 10G shows the operation of the shutter element 46. During the laser beam scanning and immediately after the detection of signals of the edges, portions of the shutter element 46 are alternately opened or made transmissible to permit alternate or sequential transmission of the rays from the transmitting sections 13a, 14a, 13b and 14b of the filter 12 (FIG. 7). With this arrangement, the same selecting function as of the foregoing embodiments is achieved. If, for example, the transmitting sections of the filter 12 are to be opened in the sequence of 13b, 13a, 14b and 14a, the sections of the liquid crystal shutter are sequentially made transmissible, as shown in FIG. 10G, in synchronism with the beam scanning. If the scanning speed is relatively high as compared with the shutter releasing operation, only one section of the shutter element may be opened or made transmissible per one scanning operation, so that all the pulse signals are taken up through four scanning operations. In such case, the signal waveforms such as (A)–(D) shown in FIG. 8 or 9 are sequentially memorized and, after all the four signals are detected, they are combined into a signal waveform such as (E) shown in FIG. 8 or 9.

In a case where four pulse signals are detected independently from each other, the sequence of the selection of the transmitting sections is not essential. Only the interrelation between a particular edge and an associated one of the transmitting sections is necessary. Further, the alternation of the transmitting sections is not required to be made so quickly. Accordingly, the shutter element may be formed by a disk with a notch which is rotated to block the unnecessary transmitting sections, such as shown in FIG. 10H.

In the foregoing, the invention has been described with reference to the arrangements for use with a very fine automatic alignment pattern and for achieving alignment with a tolerance of the order of microns or submicrons. If, however, a slightly larger error is allowable, satisfactory signal detection can be achieved without employing precise filtering at the pupil plane. This will now be described with reference to FIG. 11.

Figure 11:
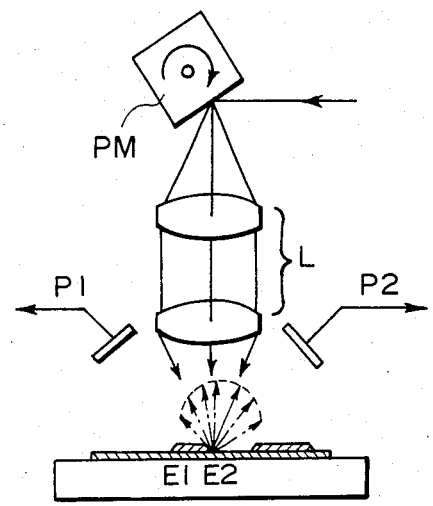
FIG. 11 shows a modified form of the position detecting apparatus according to the present invention.

FIG. 11 shows a detection system having a polygonal mirror PM, a scanning lens system L and photoreceptors P1 and P2. Each of the photoreceptors P1 and P2 is disposed so that it directly receives the diffracted rays. Reference characters E1 and E2 designate edges of an automatic alignment pattern. In operation, the polygonal mirror is rotated to scanningly deflect the laser beam. When the laser beam is incident on each edge, it is diffracted and the diffracted rays travel in determined directions. In the FIG. 11 case, each edge of the AA pattern extends orthogonally to the sheet of the drawing and, therefore, two photoreceptors are disposed along the scanning direction. If, on the other hand, the AA pattern is formed by two oppositely inclined pattern elements such as shown in FIG. 5, four photoreceptors are disposed inclinedly relative to the scanning line.

Figure 12:
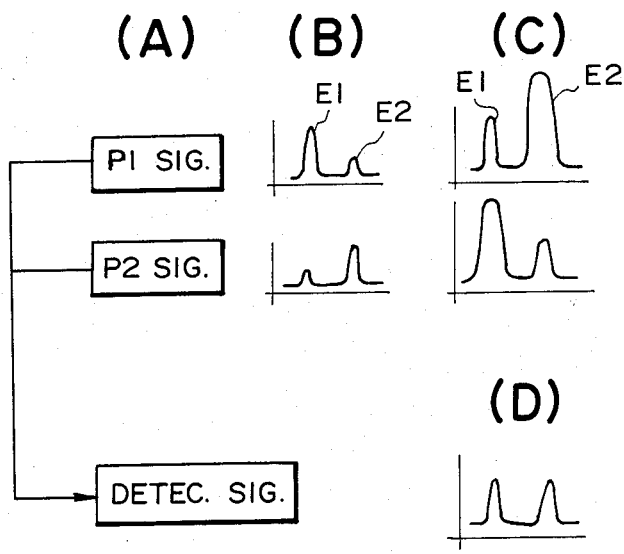
FIG. 12 illustrates the manner of combining the signals produced from the detecting system of FIG. 11.

Signal waveforms obtained by the scanning of the edges E1 and E2 in this order are shown in FIG. 12. In FIG. 12, the waveforms shown at a part (B) are those when no photoresist layer is formed while the waveforms shown at a part (C) are those when a photoresist layer is formed. In the part (B) the signal produced by the photoreceptor P1 contains a pulse E1 and a pulse E2 which is smaller than the pulse E1 and the signal detected by the photoreceptor P2 contains a pulse E1 and a pulse E2 which is greater than the pulse E1.

However, in the part (C) which shows signals when a photoresist layer is formed, the transmissively reflected rays (direct reflection rays) which have been refracted by the resist layer enter into the photoreceptor P2 with respect to the edge E1, and enter into the photoreceptor P1 with respect to the edge E2. Therefore, the pulse E2 would be expanded in the signal P1, while the pulse E1 would be expanded in the signal P2. In view of this, the output from the photoreceptor P1 is taken up with respect to the edge E1 while the output from the photoreceptor P2 is taken up with respect to the edge E2 in accordance with the present invention, to provide a combined detection signal having a waveform shown in a part (D) of FIG. 12. In this manner, correct detection is achieved.

Figure 13:
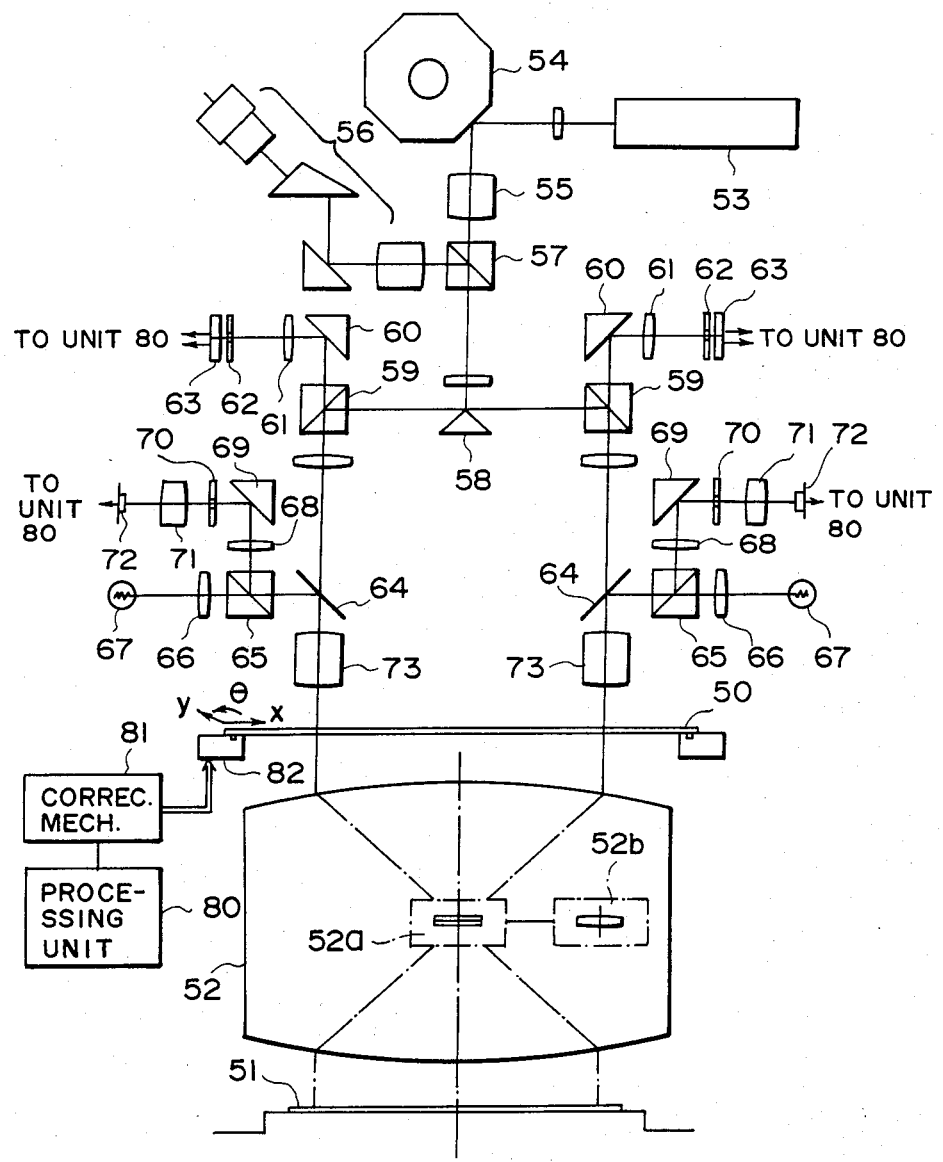
FIG. 13 is an optical cross-section showing a position detecting apparatus according to another embodiment of the present invention.

FIG. 13 shows an alignment and exposure apparatus of stepper type for manufacturing semiconductor circuit elements, according to one aspect of the present invention. The apparatus includes a projection lens 52 for projecting the image of a mask 50 onto a wafer 51 at a one-to-one magnification or a reduced scale. In a case where the alignment light and the exposure light have different wavelengths, a quarter wave plate 52a is detachably disposed in the lens system during the alignment operation which is replaced by a lens 52b during exposure. The lens 52b compensates for any focus deviation (defocus) due to the difference in the wavelength. The quarter wave plate 52a is provided for the purpose of separation of the mask reflection and the wafer reflection according to the direction of polarization. Where the alignment light and the exposure light have the same wavelength, or where the projection lens is corrected relative to both the two wavelengths, the lens 52b can be omitted and the quarter wave plate 52a may be fixedly disposed.

Figure 14:
FIG. 14 is a plan view showing an example of the arrangement of the automatic alignment patterns.

On each of the mask 50 and the wafer 51, there are provided two AA patterns, one of which is shown in FIG. 14. For example, the mark elements depicted by solid lines are provided on the wafer, while the mark element depicted by a broken line is formed on the mask.

The alignment and exposure apparatus shown in FIG. 13 further includes a laser beam source 53 which provides a laser beam linearly polarized in the direction orthogonal to the sheet of the drawing; a polygonal mirror 54 rotatable at a constant speed; an f-$\theta$ lens 55 which co-operates in the constant speed scanning of the laser beam; an observation system 56; a beam splitter 57; and a scanning field dividing prism 58 by which the laser beam is directed to one of the two AA patterns during the first half of one scanning operation and is directed to the other AA pattern during the second half of the one scanning operation. As shown in FIG. 13, the left-hand and right-hand systems following the scanning field dividing prism 58 are symmetrical, so that corresponding elements are designated by the same reference numerals. For the sake of simplicity of description, only the right-hand system will now be described. The system comprises a polarization beam splitter 59 for reflecting/transmitting the laser beam in accordance with the state of polarization thereof; a reflector 60 for deflecting the optical path; a condenser lens 61; a filter 62 which has an arrangement such as shown in FIG. 7; and a division-type detector 63. The transmitting sections of the filter 62 are arranged in accordance with the direction of the AA pattern. The sensitive regions of the four-division detector 63 are arranged in compliance with the transmitting sections of the filter 62 to receive the rays from the wafer 51. The system further includes a half mirror 64 having a small reflection factor; a polarization beam splitter 65; a condenser lens 66; a light source 67 for the observation; a relay lens 68; a reflector 69; a spatial frequency filter 70; a condenser lens 71; a photoreceptor 72 for receiving the light from the mask 50; and a microscopic objective lens 73 disposed to view the AA patterns on the mask 50 and wafer 51.

In operation, the laser beam supplied from the laser beam source 53 is incident on the polygonal mirror 54 whereat it is scanningly deflected. The deflected laser beam is converted by the f-$\theta$ lens 55 into a parallel-scan beam, and it passes through the beam splitter 57 and is incident on the prism 58. The laser beam is reflected by the left-hand inclined surface, for example, of the prism 58 during the first half of one scanning operation, and is reflected by the right-hand inclined surface of the prism during the second half of the scanning operation. The laser beam reflected from the prism 58 is again reflected by the polarization beam splitter 59 and transmitted through the half mirror 64. Subsequently, the laser beam enters into the objective lens 73 by which it is focused onto the mask 50 and then is focused onto the wafer 51 through the projection lens 52, to thereby scan both the mask and wafer. The light beam reflected by the AA pattern on the mask 50 enters into the objective lens 73 and is reflected by the half mirror 64. At the same time, a part of the reflected beam from the mask 50 passes through the half mirror 64 so that it is directed to the four-division detector 63 for the wafer detection. Since, however, this beam has been linearly polarized in the direction orthogonal to the sheet of the drawing, it is intercepted by the polarization beam splitter 59. The light beam reflected by the half mirror 64 enters into the polarization beam splitter 65 at which the light beam reflected by the mask 50 and linearly polarized in the direction perpendicular to the sheet of the drawing is reflected, whereas any noise (the light beam reflected by the wafer 51 and linearly polarized in the direction parallel to the sheet of the drawing, as will be described hereinafter) is blocked. The reflected light beam from the polarization beam splitter 65 is incident on the filter 70 by way of the relay lens 68 and the reflector 69. At the filter 70, the transmissively reflected component (direct reflection component) is intercepted while the scattered component from the AA pattern is transmitted therethrough so that it is condensed by the condensing lens 71 to be incident on the photoreceptor 72, whereby an AA signal for the mask is detected.

The scanning beam transmitted through the mask 50 enters into the projection lens 52 so that it is refractively transmitted therethrough. During transmission through the projection lens 52, the scanning beam is converted into a circularly polarized beam by the quarter wave plate 52a. Then, the scanning beam scans the wafer 51. The light beam reflected by the AA pattern of the wafer 51 again passes through the quarter wave plate 52a in the opposite direction, so that it is converted into a linearly polarized light with the phase thereof rotated through 90 degrees. Subsequently, the reflected laser beam enters into the polarization beam splitter 59 by way of the half mirror 64. Since the beam is linearly polarized in the direction parallel to the sheet of the drawing by the quarter wave plate 52a, the reflection light from the wafer 51 passes through the polarization beam splitter 59 and through the transmitting sections of the filter 62 by way of the reflector 60 and the condensing lens 61 so that it is incident on the four-division detector 63.

The alignment and exposure apparatus further includes a control processing unit 80 for selecting the output signals from the four-division detector 63 in accordance with the shape (concavity or convexity) of the AA pattern and on the basis of the time schedule of scanning operation, to establish an AA signal with respect to the wafer 51. This can be achieved either by sequentially operating the sensitive regions of the four-division detector 63 according to the rules as has been described in the foregoing; by memorizing all the output signals from all of the sensitive regions of the detector 63 and thereafter selecting the signals; or by a combination of these processes. In any event, on the basis of the AA signal thus obtained and the AA signal with reference to the mask detected by the photoreceptor 72, computation is effected in the unit 80. In accordance with the results of computation (deviation in the directions x, y and θ), a correcting mechanism 81 of the exposure apparatus is driven to move a mask chuck 82 to achieve alignment between the mask 50 and wafer 51. The wafer may, of course, be moved in place of the mask 50.

The arrangements of the AA pattern and the filter are not limited to the above-described ones. For example, if the number of the transmitting sections of the filter is twice as of the non-parallel pattern elements constituting the AA pattern, it is possible to have a variety of shapes.

Further, if it is not necessary to severely restrict the S/N characteristic of the signal, a desired signal can be obtained without employing four-division of the signal even for the AA pattern shown in FIG. 5. For example, the signals (A) and (B) shown in FIG. 8 may be detected in a combined form while the signals (C) and (D) may be detected in a combined form. In such case, the detector may be of two-division type.

In accordance with the present invention, as has hitherto been described in the foregoing, redundant signals are not used in the signal processing even if a transparent layer such as the resist layer is formed on an object to be detected. Therefore, the position of the alignment mark pattern can be correctly and accurately determined. Since the alignment can be achieved with a high precision and the signal itself is surely correct, the time required for achieving the alignment and the number of alignment operations can be decreased.

While the invention has been described with reference to the structures disclosed herein, it is not confined to the details set forth and this disclosure is intended to cover such modifications or changes as may come within the purposes of the improvements or the scope of the following claims.

What is claimed is:

1. An apparatus for detecting a position of an object having a stepped portion and having a substantially transparent surface layer, comprising:

illuminating means for illuminating the object with light, so that light is scattered by the stepped portion, and so that light is reflected by the object and then refracted by the transparent layer;

sensing means for sensing light that has been scattered by the stepped portion in such a direction as not to be influenced by light reflected by the object and then refracted by the transparent layer; and detecting means for detecting a position of the object on the basis of an output of said sensing means.

2. An apparatus according to claim 1, wherein said sensing means senses the light which has been scattered by the stepped portion in a first direction and the light which has been scattered by the stepped portion in a second direction, independently from each other.

3. An apparatus according to claim 2, wherein said sensing means includes first sensor means for sensing the light scattered in the first direction and second sensor means for sensing the light scattered in the second direction.

4. An apparatus according to claim 3, wherein said detecting means uses an output of said second sensor means when the light reflected by the object and then refracted by the transparent layer travels in the first direction, and uses an output of said first sensor means when the light reflected by the object and then refracted by the transparent layer travels in the second direction.

5. An apparatus according to claim 3, wherein said detecting means uses either said first sensor means or said second sensor means, and the sensor means so used is preselected in accordance with the configuration of the stepped portion.

6. An apparatus according to claim 1, wherein said illuminating means includes an objective lens and a scanning optical system for scanning the object with the light through the objective lens, and wherein said sensing means includes a filter for separating light scattered by the stepped portion from light reflected by the object and then refracted by the transparent layer, and further includes a plurality of sensor means for photoelectrically sensing the scattered light passed through the filter.

7. An apparatus according to claim 6, wherein said plurality of sensor means includes first sensor means for sensing the light scattered by the stepped portion in a first direction, and second sensor means for sensing the light scattered by the stepped portion in a second direction.

8. A method of detecting a position of an object having a stepped portion and having a substantially transparent surface layer, comprising the steps of:

illuminating the object with light so that light is scattered by the stepped portion in a first direction and in a second direction, and so that light is reflected by the object and then refracted by the transparent layer;

sensing light which has been scattered by the stepped portion in the first direction and producing a corresponding first output, and sensing light which has been scattered by the stepped portion in the second direction and producing a corresponding second output;

selecting the second output, when the light reflected by the object and then refracted by the transparent layer travels in the first direction, while selecting the first output, when the light reflected by the object and then refracted by the transparent layer travels in the second direction; and detecting a position of the object on the basis of the selected output.

* * * * *